United States Patent [19]

Haus et al.

[11] Patent Number: 4,464,759
[45] Date of Patent: Aug. 7, 1984

[54] SEMICONDUCTOR DIODE LASER SYSTEM

[75] Inventors: Hermann A. Haus, Lexington; Lance A. Glasser, Watertown; Ping-Tong Ho, Belmont, all of Mass.

[73] Assignee: Massachusetts Institute of Technology, Cambridge, Mass.

[21] Appl. No.: 550,064

[22] Filed: Nov. 9, 1983

Related U.S. Application Data

[63] Continuation of Ser. No. 303,940, Sep. 21, 1981, , which is a continuation of Ser. No. 168,329, Jul. 11, 1980, , which is a continuation of Ser. No. 929,085, Jul. 31, 1978.

[51] Int. Cl.³ .............................. H01S 3/098
[52] U.S. Cl. ..................... 372/18; 372/19; 372/20; 372/97
[58] Field of Search ............... 372/19, 18, 20

[56] References Cited

U.S. PATENT DOCUMENTS 4,079,339 3/1978 Kobayashi et al. ............ 331/94.5 C

FOREIGN PATENT DOCUMENTS 984590 2/1965 United Kingdom ............... 331/94.5

OTHER PUBLICATIONS

*Applied Physics Letters*, 15, 203 (1969); Ripper et al., "Frequency Pulling and Pulse Position Modulation of Pulsing CW GaAs Injection Lasers".
*Applied Physics Letters*, 15, 105 (1969); Paoli et al., "Optical Pulses from CW GaAs Injection Lasers".
*Applied Physics Letters*, 25, 744 (1974); Paoli et al., "Single Longitudinal Mode Operation of CW Junction Lasers by Frequency-Selective Optical Feedback".
*Applied Physics Letters*, 23, 25 (1973); Rossi et al., "High-Power Narrow-Linewidth Operation of GaAs Diode Lasers".

*Primary Examiner*—William L. Sikes
*Assistant Examiner*—Léon Scott, Jr.
*Attorney, Agent, or Firm*—Arthur A. Smith, Jr.; Thomas J. Engellenner

[57] ABSTRACT

A semiconductor diode laser system with microwave mode locking. The system includes a semiconductor laser diode and an external reflector positioned to receive radiation that emits from the diode and reflects the same back into the diode, the microwave mode locking serving to modulate the radiation and the external reflector being properly positioned to return the radiation to the diode at a return time equal to the period of the drive signal or a submultiple thereof.

7 Claims, 12 Drawing Figures

SEMICONDUCTOR DIODE LASER SYSTEM

The Government has rights in this invention pursuant to Contract No. DAAB07-76-C-1400 awarded by the Joint Services Electronic Program, a Department of the U.S. Army.

This application is a continuation of application Ser. No. 303,940, filed Sept. 21, 1981, which is a continuation of Ser. No. 168,329 filed July 11, 1980 which is a continuation of Ser. No. 929,085 filed July 31, 1978.

The present invention relates to semiconductor laser systems.

Picosecond optical pulse sources have been playing an increasingly important role in the study of ultra-fast processes and have potential application to high speed electronics. Interest in such techniques has recently been stimulated by the generation of picosecond pulses at high repition rate, but conventional sources have remained large and cumbersome laboratory systems. The present invention, however, as hereinafter disclosed, presents a compact picosecond pulse generator using a cw semiconductor diode laser. Such compact laser pulse generator has a number of practical uses. Among such uses are optical communications, ultra-fast computers, testing of optical fibers, producing one-hundred percent modulation of a laser at GHz repetition rates, testing optical switches and gates, testing fast detectors and optical communication channels, sample and hold circuitry, plasma diagnostics, optical sampling of fast phenomena, picosecond spectroscopy, investigation of material properties, fast electronics, and so forth.

Accordingly, a principal object is to provide a small-size, economical laser whose output pulses are very short.

Another object is to provide such a laser with laser pulses as short as twenty picoseconds at a repetition rate of three billion per second.

Still another object is to provide a semiconductor laser with the foregoing characteristics and one that provides continuous wave (cw) pulses.

A further object is to provide the pulse generator to a pulse code modulated communication system.

A further object is to provide a source of well-separated pulses that can be modulated at a relatively convenient rate and multiplexed to provide a high rate optical communication channel.

A further object is to provide a source for an optical radar system for high resolution distance measurements.

These and still further objects are addressed hereinafter.

The foregoing objects are achieved in a compact, mode-locked semiconductor laser system that includes a semiconductor laser diode and an external reflector, the external reflector being positioned to receive optical radiation and to reflect the same back into the diode. Means is provided to pump the diode to create therein inverted electron population of the electronic energy levels of the semiconductor to provide, by radiative recombination, said optical radiation therein. Microwave signal drive means is connected to the diode to modulate the optical radiation. The external reflector is appropriately positioned relative to the diode so as to form an optical resonator whose optical length serves to provide a return time of the reflected optical radiation that is related to the period of the drive signal of the microwave signal drive in a way that said return time about equals the period of the microwave drive signal, or, preferably, a submultiple of said period.

The invention is hereinafter described with reference to the accompanying drawing in which FIG. 1 is a diagrammatic representation of a circuit that includes a mode-locked semiconductor laser system containing a laser diode and an external mirror or other external reflector that forms a resonant cavity or optical resonator;

Figure 1:
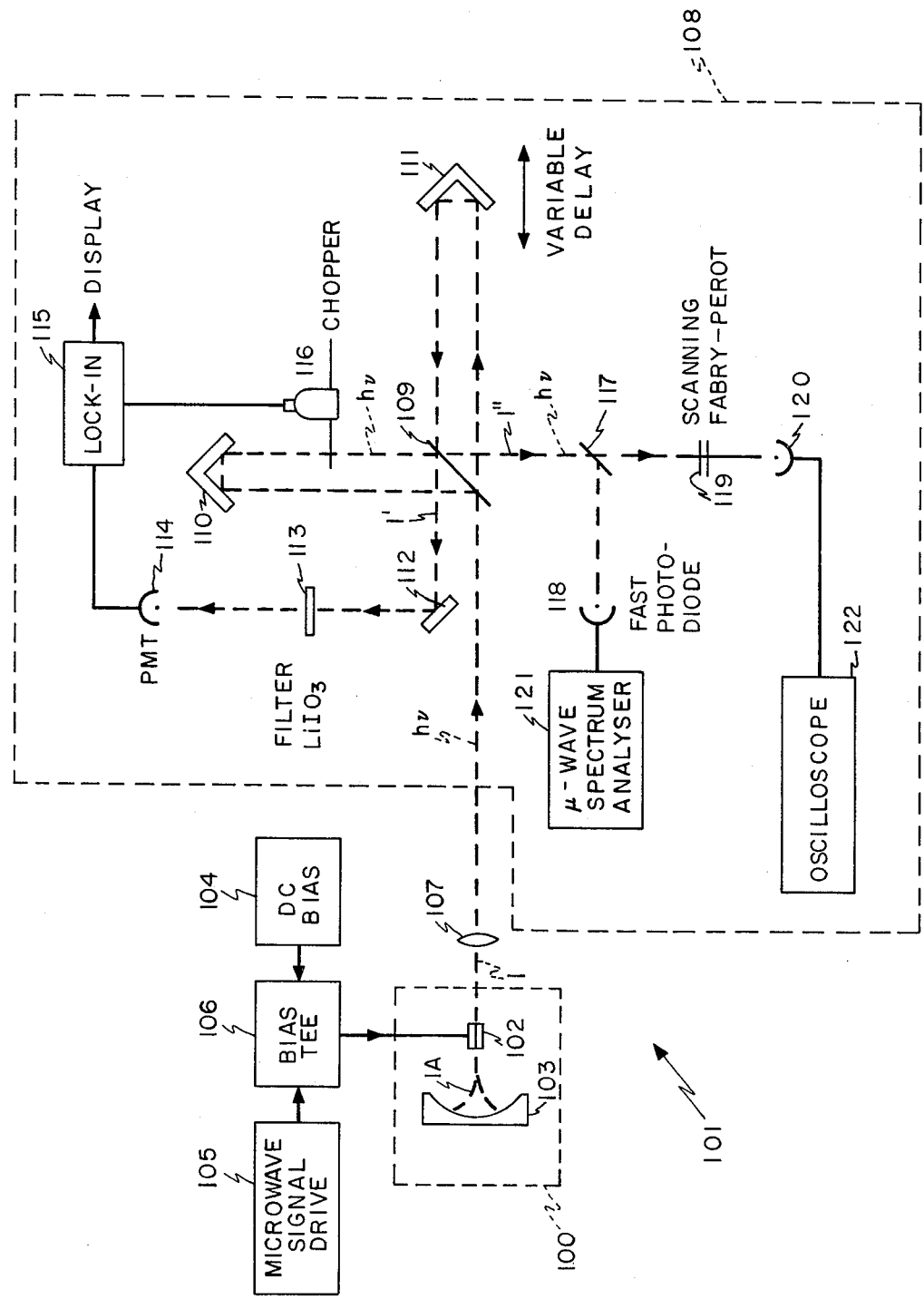
Figure 3:
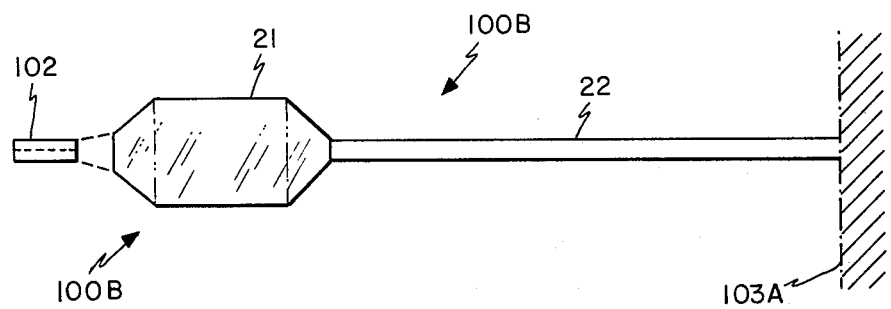
FIG. 3 is a side-view, diagrammatic representation of a modification of a portion of the system of FIG. 1 in that an optical fiber is employed as part of the optical resonator and coupling optics are provided between the laser diode and the optical fiber.
Figure 8A:
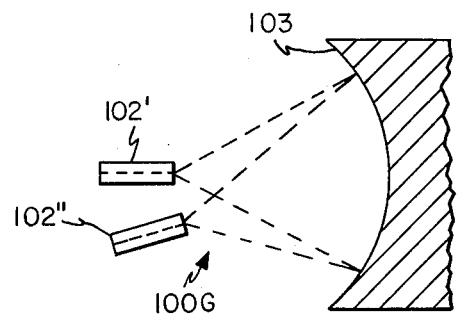
FIG. 8A is a diagrammatic, side-view representation showing a plurality of laser diodes as in FIG. 1 with one mirror or other external reflector.
Figure 8B:
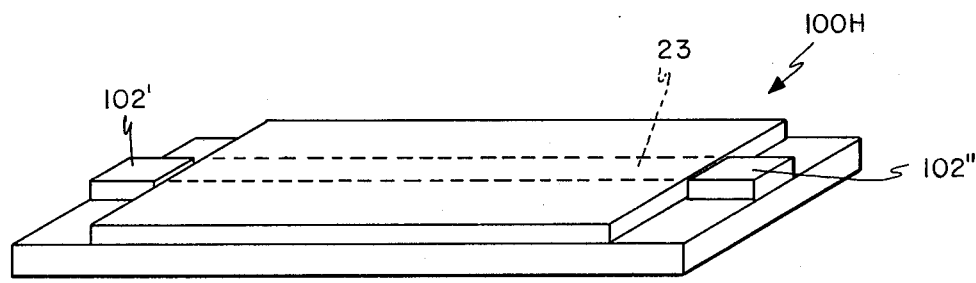
FIG. 8B is an isometric view like that of FIG. 4 but including two laser diodes.
Figure 8C:
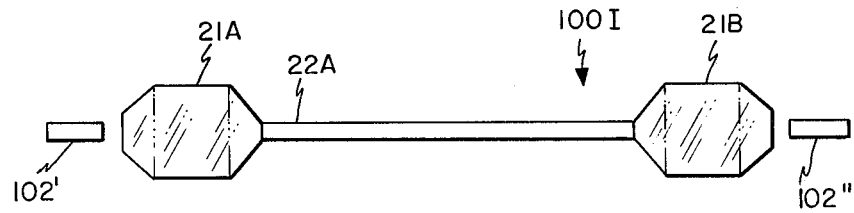
Figure 9:
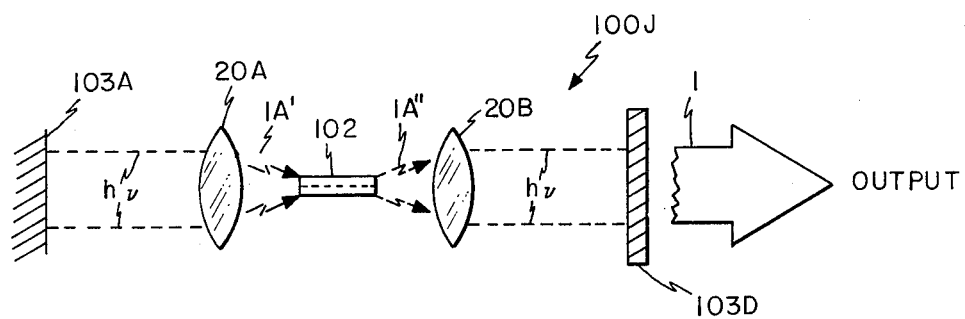

FIG. 8C is a diagrammatic, side-view representation like that of FIG. 3 except including two laser diodes and two coupling optics to couple the two laser diodes to the optical fiber; and FIG. 9 is a diagrammatic, side-view representation of a modification of a portion of the system of FIG. 1 showing a single laser diode interacting with multiple lenses and mirrors to form said optical cavity or optical resonator.

Turning now to FIG. 1, the circuitry labeled 101 includes a compact laser 100 consisting of a laser diode 102 with an optical resonator or resonant cavity that has an external member, namely, a mirror or other reflector 103. (In later figures the optical resonator or resonant cavity disclosed has additional external members.) The external reflector 103 in an actual device is a five centimeter mirror which is precisely positioned relative to the diode 102 to receive optical radiation that emits from the diode and to reflect the same back into the diode at a very precise return time, as noted below. Pumping of the diode 102 in FIG. 1 to provide the necessary temperature inversion is provided by a dc bias 104 through a bias tee 106. A further signal to the diode 102 is derived from a microwave signal drive 105 which is also connected to the diode 102 through the bias tee 106. As is evident in the explanation below, the microwave signal drive and the bias are combined in the bias tee 106 to supply a composite signal to the diode 102 to modulate the optical radiation labeled 1 that emits therefrom. The output radiation 1 (also labeled hv in FIG. 1) is focused by the lens or lenses 107 and delivered to analyzing circuit 108 for analysis, as later discussed. For present purposes, the external reflector 103 is appropriately positioned relative to the diode 102 so that the return time of the optical radiation labeled 1A in FIG. 1 about equals a submultiple of the period of the drive signal of the microwave signal from the drive 105 to provide mode-locking; in a special case the return time of the optical radiation 1A can equal the period of the drive signal.

An actual device of the type described in the previous paragraph has been built and tested. It generated twenty picosecond pulses in a laser system that is about the size of a facial tissue box and included the elements 100, 104, 105 and 106. Such short pulses have previously been observed only with large, very expensive and high-powered lasers. A laser pulse of twenty picoseconds in air is about six millimeters long. About three billion pulses per second were generated on a cw basis, a rate convenient for communication uses. Some details of the lasting portion of FIG. 1 are now taken up.

The actual system made and tested, as above noted, generates twenty picosecond optical pulses at microwave repetition rate from a GaAlAs double heterostructure diode operating cw at room temperature. The diode is operated in an optical resonator that includes an external member or members and is actively modulated at 3 GHz. The pulses are measured by auto-correlation using SHG in $LiIO_3$. They are the shortest pulses ever reported for a cw laser diode.

If the laser diode optical gain is to be modulated so as to produce mode locking, the relatively long relaxation time of the population inversion of the diode 102 requires operation of the diode with the external reflector 103 to give a resonant cavity roundtrip time of the order of a nanosecond. There follows a short discussion of the analyzing circuit or detection system 108.

The detection system 108 includes a beam splitter 109 which separates the pulse-train incident upon it into the two replicas which are reflected by corner reflectors 110 and 111. One of the corner reflectors is movable so that a variable delay can be introduced between the two pulse train replicas. The beam labeled 1' is a recombination of the two beams reflected by the corner reflectors 110 and 111, but the beam labeled 1" is just a portion of the beam reflected by the corner reflector 111.

The horizontal beam is reflected by a mirror 112 into a $LiIO_3$ crystal 113 which doubles the frequency of the incident radiation. The doubled radiation is detected in a photomultiplier 114. The photomultiplier output is fed to a lock-in amplifier 115. One of the optical beams is chopped by a chopper 116; the chopping rate is fed also into the lock-in amplifier 115, resulting in increased sensitivity of detection of the photomultiplier output.

The vertical recombined beam is split in a beam splitter 117. Part of the beam is detected in a fast photodiode 118 whose output is displayed by a microwave spectrum analyzer 121. The spectrum analyzer 121 shows beats of noise at a frequency corresponding to the inverse roundtrip time, i.e., 3 GHz in the present example, as explained below. These beats are useful in monitoring the correct modulation frequency and also indicate the success of modelocking by a radical change in the spectrum when modelocking is achieved. The other part of the beam passing through the beam splitter 117 continues through a scanning Fabry Perot 119 to a detector 120 which monitors the optical spectrum of the laser diode and provides an output signal to an oscilloscope 122.

In the mode-locked, semiconductor laser system shown in FIG. 1, the laser diode 102 is uncoated on both output surfaces and is placed at the center of curvature of the external aluminum mirror 103. The mirror 103 is spherical and has, as above noted, a radius of five centimeters. The composite resonator or resonant cavity consists of the cavity formed by the external mirror 103 and the outermost diode cleavage plane plus an internal Fabry-Perot type resonator defined by the two faces of the laser diode 102. The isolated laser diode has a threshold current of 190 mA; the output wavelength is centered at ~810 nm and is divided between several longitudinal modes 3.17 Å apart. The composite resonator reduces the threshold to 145 mA and the emission line width to no more than 0.5 Å, as measured by a grating spectrometer. There are, however, multiple external resonator modes present as evidenced by a 3 GHz=c/2L beat signal on the microwave spectrum analyzer 121. The dc drive current of the laser is modulated with several milliwatts of microwave power at the observed 3 GHz beat frequency. The effect of tuning the modulation frequency may be observed by the spectrum analyzer 121.

Microwave modulation in the actual system previously described was applied to the laser 100 through the bias tee 106, as above noted. Impedance matching was achieved by a shunt capacitance wired in cascade with a 50Ω microstrip line which was terminated by the diode 102. The 3 dB matching bandwidth was 150 MHz. No more than 6 mW of microwave drive was used in this experiment. Intensity correlation of the beam 1 was made by SHG in the $LiIO_3$ crystal 113. The fundamental (infrared) beam incident on the $LiIO_3$ crystal 113 is composed of two beams of relative intensities 4:5. The weaker beam is chopped when correlation measurements are made.

An intensity correlation curve was made which showed pulses of 23 ps FWHM, assuming a Gaussian pulse shape. The unmodulated laser output had a correlation peak about twice as wide and with a much lower contrast ratio. It was found that dc drive currents between 150 and 200 mA did not change the pulse width significantly; 200 mA were never exceeded when modulation was on, for fear of destroying the laser diode 102. Aligning the laser diode 102 with the external mirror 103 is critical in obtaining short pulses.

As is noted above, the optical resonator or resonant cavity of the laser 100 includes members within and without the laser diode 102. FIGS. 2-4, 6A, 6B, 7, 8A, 8B and 9 discussed below show variations of the resonator of FIG. 1 and FIG. 5 shows a variation of the laser diode 102. In the discussion below of the further figures, an attempt is made to apply the same or similar labels to elements that perform the same or similar functions to the elements in FIG. 1.

Figure 2:
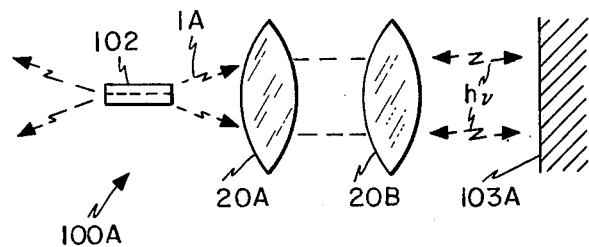
FIG. 2 is a diagrammatic, side-view representation of a modification of a portion of the system of FIG. 1 in that a plurality of lenses are interposed between the laser diode and the external reflector.

The compact laser shown at 100A in FIG. 2 includes one or more lenses 20A and 20B interposed between the laser diode 102 and a plane (or curved) mirror or other external reflecting surface 103A. Th optical resonator of the compact laser 100A includes the lenses 20A and 20B as well as the air space between the laser diode and the reflecting surface 103A, plus the propagating distance of the optical radiation within the laser diode 102.

In the laser labeled 100B in FIG. 3, the optical resonator further includes an optical fiber 22 terminating in a reflecting surface which may be the surface 103A or a cleavage plane at the end of the optical fiber 22. Coupling optics 21 serve to couple optical radiation to and from the fiber 22.

Figure 4:
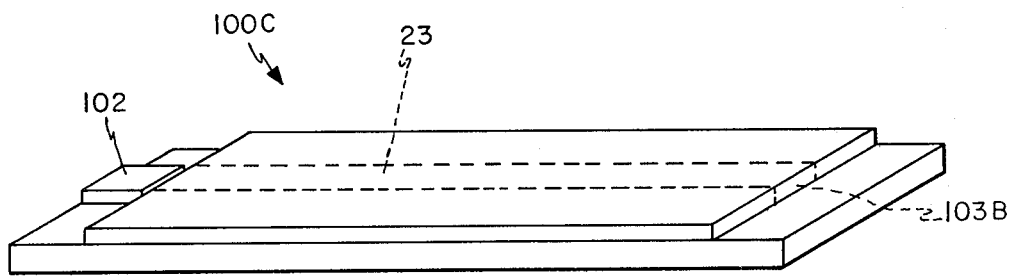
FIG. 4 is a perspective view of a laser diode (greatly enlarged), like the laser diode of FIG. 1 with an optical waveguide forming part of the optical resonator.
Figure 5:
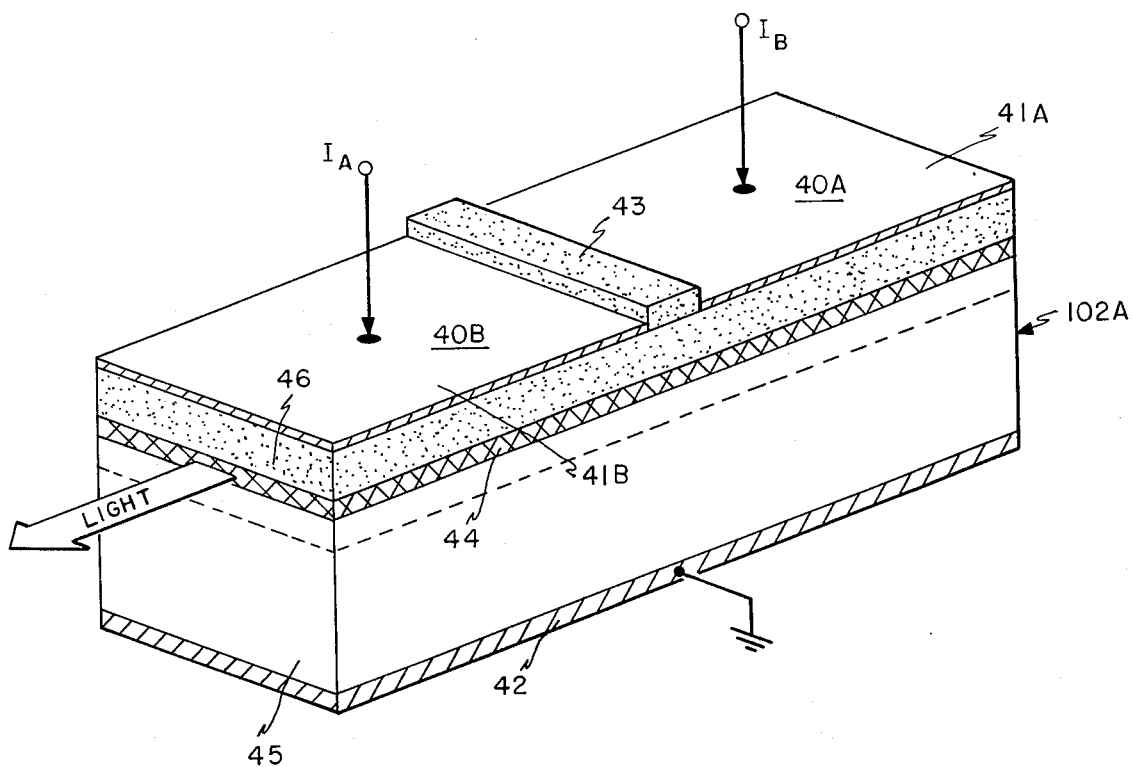
FIG. 5 is an isometric, greatly enlarged view, diagrammatic in form, of a laser diode which is one form the laser diode of FIG. 1 can take and is a double-heterostructure, two-section, stripe-geometry semiconductor laser.
Figure 6A:
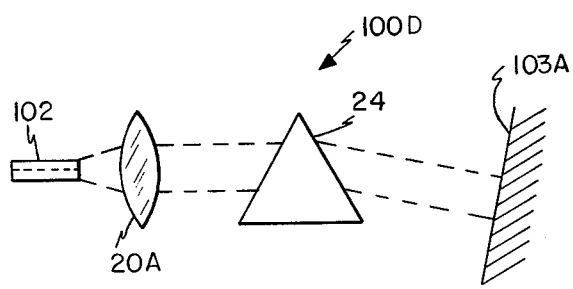
FIG. 6A is a diagrammatic, side-view representation of a modification of a portion of the laser system of FIG. 1, showing a series of lenses and a prism interposed between the laser diode and the mirror or other external reflector.
Figure 6B:
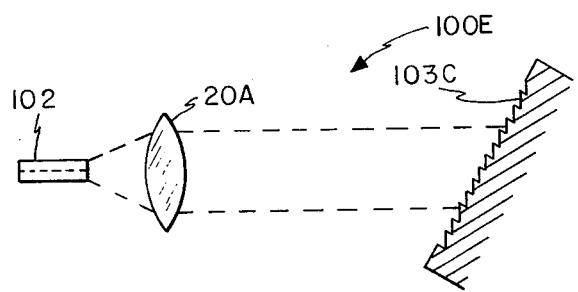
FIG. 6B is a diagrammatic, side-view representation of a modification of the representation of FIG. 6A.
Figure 7:
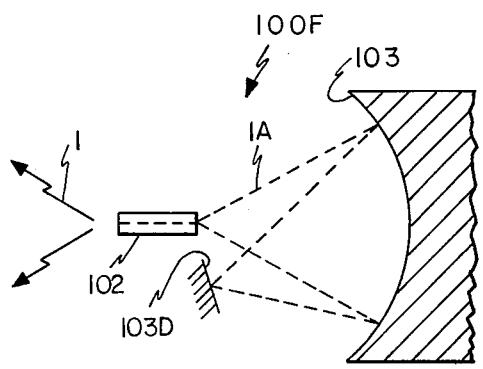
FIG. 7 is a diagrammatic, side-view representation of a modification of a portion of the laser system of FIG. 1, showing a plurality of mirrors or other external reflectors in cooperative interaction with the laser diode.

The laser marked 100C in FIG. 4 includes as part of its optical resonator an optical waveguide 23 which has at its far end a reflecting surface 103B to return optical radiation to the laser diode 102 in FIG. 4.

The compact lasers 100D, 100E, 100F, 100G, 100H, 100I and 100J in FIGS. 6A, 6B, 7, 8A, 8B, 8C and 9, respectively, are further modifications of the laser 100. The laser 100D has a lens or series of lenses 20A and a prism 24 within the optical cavity thereof; the laser 100E has a grating 103C that forms its external reflecting surface; other bandwidth controlling elements such as bandpass filter, can be employed; the laser 100F includes an external reflector 103D in addition to the external reflector 103; the laser 100G includes two laser diodes 102' and 102" plus the reflecting surface 103; the laser 100 H also has two laser diodes 102' and 102" disposed respectively at opposite ends of an optical waveguide, again marked 23 in FIG. 8B; the laser 100I has laser diodes 102' and 102", optical fiber 22A with coupling optics 21A and 21B; and in the laser 100J the laser diode 102 is located between lenses 20A and 20B so that its optical radiation 1A' and 1A" is focused thereby upon the reflecting surface 103A and a partially transparent mirror 103D.

Whereas the laser diode 102 discussed above is a single-section diode, the laser diode labeled 102A in FIG. 5 is a two-section diode composed of sections 40A and 40B separated by a $SiO_2$ insulating strip 43 (etched or scribed interfaces may also be used to separate the two sections). The laser diode 102A may be used in the configuration above discussed. The two sections 40A and 40B can be energized and modulated in an almost independent manner by currents $I_A$ and $I_B$, respectively. The laser diode 102A consists of an Au-Zn metallizations 41A and 41B and an Au-Sn metallization 42 which serve as electrodes. A GaInAsP active region 44 is formed between an InP(n) substrate 45 and an InP(p) cap 46. Light emits from the active region 44. The operation is now taken up.

Previously it is explained that the threshold for lasing of a laser diode such as the laser diode 102 differs from a condition in which the diode is employed within a resonator having parts external to the diode and a condition in which the resonator is wholly within the diode. The discussion here on the matter of threshold is in the context of the former situation, that is, in the context of a laser like that shown in FIG. 1, for example.

In the above context, the section 40B, say, can be drawn below threshold so as to act as a saturable absorber. In that situation, if the section 40A is drawn above threshold and modulated by a microwave signal as previously discussed, the saturable-absorber action of the section 40B will lead to pulse shortening. Alternatively, the section 40B, below threshold, can be driven by a microwave signal to achieve loss modulation independent of the dc gain produced in the section 40A. The separation of the modulation function from the gain excitation gives additional degrees of freedom in optimizing the mode-locking operation. Both sections can be operated above threshold. The same principles can be realized by two separate diodes placed in the same resonator; see the diodes 102' and 102" in FIGS. 8A-8C.

Further modifications of the invention herein disclosed will occur to persons skilled in the art and all such modifications are deemed to be within the spirit and scope of the invention as defined by the appended claims.

What is claimed is:

1. A compact, continuous wave, dc pumped laser system for creating pulses in the picosecond range comprising:
   (a) a semiconducting laser diode comprising two sections separated by an insulating strip, at least one of said sections being an active region;
   (b) bias means for independently pumping said sections thereby creating within at least one of said sections a population inversion of energy states whereby said diode emits optical radiation;
   (c) external reflector means arranged to reflect said optical radiation back into said diode, an optical resonant cavity delimited by said external reflector means and an outermost cleavage plane of said diode; and
   (d) microwave drive signal means combined with said dc bias means through a bias tee in order to supply a composite signal to at least one of said sections of said diode to modulate said optical radiation; thereby separating modulation from dc gain excitation, whereby the separation between said external reflector means and said diode produces a round-trip time of the reflected optical radiation that approximately equals a period of said drive signal or a sub-multiple thereof.

2. The apparatus of claim 1 wherein said external reflector means is a curved mirror.

3. The apparatus of claim 1 wherein said optical cavity further includes a plurality of lenses located between said diode and said reflector means.

4. The apparatus of claim 1 wherein said optical cavity further includes an optical fiber located between said diode and said reflector means.

5. The apparatus of claim 1 wherein said optical cavity includes an optical waveguide located between said diode and said reflector means.

6. The apparatus of claim 1 wherein said external reflector means comprises a diffraction grating.

7. The apparatus of claim 1 wherein said microwave drive signal means produces a modulation signal which is coupled into the active region of at least about three GHz.

* * * * *